United States Patent
Su et al.

(10) Patent No.: US 6,694,473 B1
(45) Date of Patent: Feb. 17, 2004

(54) PARALLEL SIGNAL DECODING METHOD

(75) Inventors: Wei-Ming Su, Taipai (TW); Shih Yung Chen, Taipei (TW)

(73) Assignee: Via Technologies, Ltd., Taipei (TW)

( * ) Notice: Subject to any disclaimer, the term of this patent is extended or adjusted under 35 U.S.C. 154(b) by 563 days.

(21) Appl. No.: 09/599,009

(22) Filed: Jun. 22, 2000

(30) Foreign Application Priority Data

Jul. 16, 1999 (TW) ........................................ 88112056 A

(51) Int. Cl.[7] .............................................. H03M 13/00
(52) U.S. Cl. ..................... 714/755; 714/785; 714/769
(58) Field of Search ......................... 714/755, 756–759, 714/784–789, 795, 769

(56) References Cited

U.S. PATENT DOCUMENTS

| | | | | |
|---|---|---|---|---|
| 4,845,713 A | * | 7/1989 | Zook | 714/784 |
| 5,134,619 A | * | 7/1992 | Henson et al. | 714/770 |
| 5,384,788 A | * | 1/1995 | Parks et al. | 714/758 |
| 5,408,477 A | * | 4/1995 | Okada et al. | 714/755 |
| 5,414,719 A | * | 5/1995 | Iwaki et al. | 714/785 |
| 5,422,890 A | * | 6/1995 | Klingsporn et al. | 714/723 |
| 5,438,577 A | * | 8/1995 | Nakase et al. | 714/785 |
| 5,541,937 A | * | 7/1996 | Iwamura | 714/785 |
| 5,623,608 A | * | 4/1997 | Ng | 711/137 |
| 5,715,262 A | * | 2/1998 | Gupta | 714/784 |
| 5,802,602 A | * | 9/1998 | Rahman et al. | 711/204 |
| 6,061,760 A | * | 5/2000 | Huang | 711/112 |
| 6,158,040 A | * | 12/2000 | Ho | 714/770 |
| 6,167,551 A | * | 12/2000 | Nguyen et al. | 714/770 |
| 6,332,206 B1 | * | 12/2001 | Nakatsuji et al. | 714/755 |
| 6,374,384 B1 | * | 4/2002 | Ohta et al. | 714/784 |

OTHER PUBLICATIONS

Arnold, 'Verilog Digital Computer Design—Algorithms to Hardware', Prentice–Hall 1999, pp. 217–247.*
Standard ECMA–130, ECMA, Jun. 1996, pp. 25–30.*

* cited by examiner

*Primary Examiner*—Albert Decady
*Assistant Examiner*—Guy Lamarre
(74) *Attorney, Agent, or Firm*—Rabin & Berdo, P.C.

(57) ABSTRACT

The invention discloses a signal decoding method for C3 decoding on a data storage medium. The data storage medium contains a lot of sectors, and each sector contains two C3 codes. Each C3 code contains a plurality of P codes and Q codes. The syndrome operation for an (N+1)th code and an error-correction for an N-th code are pipelined. An address for the (N+1)th code minus a predetermined value is an address for the N-th code.

9 Claims, 4 Drawing Sheets

|    | 0    | 1    | 2    | ...  | 41   | 42   |           |
|----|------|------|------|------|------|------|-----------|
| 0  | 0000 | 0001 | 0002 | .    | 0041 | 0042 |           |
| 1  | 0043 | 0044 | 0045 | .    | 0084 | 0085 |           |
| 2  | 0086 | 0087 | 0088 | .    | 0127 | 0128 |           |
| 3  | 0129 | 0130 | 0131 | ...  |      | 0171 |           |
| 4  | 0172 | 0173 |      | ...  |      | 0214 | extra data|
| .  | P→   |      |      |      |      |      |           |
| .  |      |      |      |      |      |      |           |
| .  |      |      |      | Q↗   |      |      |           |
| 22 | 0946 | 0947 | 0948 | ...  | 0987 | 0988 |           |
| 23 | 0989 | 0990 | 0991 | ...  | 1030 | 1031 |           |
| 24 | 1032 | 1033 | 1034 | 1072 | 1073 | 1074 | P-parity  |
| 25 | 1075 | 1076 | 1077 | 1115 | 1116 | 1117 |           |
| 26 | 1118 | 1119 | 1120 | ...  | 1143 |      | Q-parity  |
| 27 | 1144 | 1145 | 1146 | ...  | 1169 |      |           |
|    | 0    | 1    | 2    | ...  | 25   |      |           |

FIG. 1 (PRIOR ART)

P CODE | 24 BYTES CODE WORD | 2 BYTES PARITY-CHECK |

Q CODE | 43 BYTES CODE WORD | 2 BYTES PARITY-CHECK |

PARALLEL SIGNAL DECODING METHOD

This application incorporates by reference Taiwanese application serial No. 88112056, filed Jul. 16, 1999, of which this application is a translation.

BACKGROUND OF THE INVENTION

1. Field of the Invention

The invention relates in general to a decoding method, and more particularly to a method of decoding coded data in parallel processing and pipeline mode.

2. Description of the Related Art

As computer technology is progressing, people have more demand on the products derived from it. The processing rate performed by the computers become faster and faster. People depend much more on computers for processing a large amount of data and executing complicated software. Therefore, people have more demand on data storage media, for example, floppy disks, compact disks (CDs), hard disks.

It is sometimes possible that data storage media may suffer from physical damage, for example, scratches, during production or use. In order to handle erroneous data and/or loss data due to damage of the data storage media, or pollution, data storage in data storage media such as compact disks is complete through a series of coding operations on the incoming data. The coding and the corresponding decoding operations effectively provide a way to minimize the effects of an error on the disk. Generally, the incoming user data is divided into a series of data units. The coding operations add a number of parity codes to each data unit for error-detection and correction codes purposes. Additionally, interleaving technique is involved in the coding operations for the enhancement of the error-correction probability by scrambling the coded data (i:e. a selection of data in a data unit is distributed over multiple data units). Furthermore, a number of codes for different functions, such as synchronization code, control code and protection code, are added to the resulting data unit. Thus, resulting coded data units are obtained as basic data units that are actually stored into the data storage media.

Therefore, when basic data units stored in the data storage media are read, a series of decoding operations are performed on the basic data units, resulting in the original user data. During decoding operations, the erroneous data due to reading error or damage to the media are detected and corrected according to the corresponding error-detection and correction method, which uses the parity codes, and the scrambled coded data are de-interleaved. By the decoding operations, the effects of an error on the disk are minimized.

The encoding of CD-read only memory (CD-ROM) information is governed by International Standard Organization (ISO)/IEC 10149, which is an extended specification of the CD-digital audio. Their relationship and the encoding and decoding method that the CD-ROM format based on are also disclosed in the U.S. Pat. Nos. 4,413,340 and 4,680,764.

As a brief summary of the encoding operations according to the CD-ROM format, when the user data other than digital audio are stored in a CD-ROM, the user data are encoded through a series of encoding operations, namely C3 encoding, C2 encoding, interleaving, and C1 encoding. After the encoding operations, a series of encoded data units are obtained which are stored in the CD-ROM. The interleaving operation repartitions frames of C2 coded data into different frames for C1 encoding. After interleaving, if data is damaged, the damaged data is dispersed among different frames of the decoded data, and thus correction probability is enhanced.

Therefore, when data units are read from a CD-ROM, the following decoding operations are performed on the data units respectively: C1 decoding, deinterleaving, C2 decoding, and C3 decoding, whereby deinterleaving is a reversed operation of interleaving.

As mentioned above, the encoding operations provide a way of error detection and correction in order to minimize the effects of erroneous data on the data storage media. Since the development of information theory and coding theory in 1948, numerous types of error-correcting systems have been created and developed. As implementations of the encoding and decoding methods arises, the data storage media or communication systems are developed into products which are reliable and efficient.

The first error-correcting system corrected a single bit in error in a group of bits. Shortly thereafter, error-correcting systems were developed to correct a single burst of bit errors in a block of bits. Error-correcting systems operate on data either as a set of bits or as a set of bytes, where the number of bits per byte is normally 8, but can be any number greater than 1. Error-correcting systems that operate on bits are called binary error-correcting systems and those that operate on bytes are called non-binary error-correcting systems. Early error-correcting systems are examples of binary systems.

Non-binary error-correcting systems were implemented after the invention in 1968 of an iterative algorithm to solve the key decoding equation known as the Berlekamp-Massey algorithm in honor of its inventors. Since 1968, several other iterative algorithms have been invented to solve the key decoding equation. In addition, algorithms, which operate on matrices, have been developed to solve the key decoding equation. Some decoding methods do not use the key decoding equation.

One of the most commonly used non-binary error-correcting schemes is known as Reed-Solomon Code, and was first described in "Polynomial codes over certain finite fields", Reed I. S and Solomon G, Journal of Society of Industrial Application Mathematics 8, 300–304 (1960). The basic concepts of Reed-Solomon coding are now well known to those of ordinary skill in the art. Many attempts have been made by the art to improve the basic Reed-Solomon system. In addition, many disclosures for preparing an encoder and/or decoder for Reed-Solomon codes arise. For example, Reed-Solomon encoders and decoders are disclosed in U.S. Pat. Nos. 5,600,659 and 5,711,244. The Reed-Solomon codes are widely used in magnetic disk drives, optical disk drives, magnetic tape drives and in communications systems.

Nearly all conventional Reed-Solomon error-correcting systems are implemented such that most of the encoding and decoding operations are performed in a serial byte-by-byte fashion. Some Reed-Solomon implementations solve the key decoding equation in a parallel fashion, but nearly all implementations of Reed-Solomom error-correcting system encode incoming data serially, generate the syndrome serially and determine the most-likely error pattern serially. Thus, it leads to limit performance. Some prior Reed-Solomon error-correcting systems correct errors only, some correct erasures only and some correct both errors and erasures. (An error is a byte in error about which no information is known. An erasure is a byte that is likely to be in error and the location is known by the decoder before decoding begins. In the invention, an erasure is referred to as a byte failure location.)

In prior Reed-Solomon error-correcting systems that use byte failure location information, this information is transmitted directly from the transmission or storage channel(s) to the decoder. These systems require an entire block of data to be received before decoding can begin, so, data buffer must be provided for storing at least one block of data. For example, in disk array systems where the error-correction system within each disk drive is used to indicate a failed drive, an entire sector of data must be read from each disk in the array before byte failure location information can be determined.

Error correcting scheme of compact disks is based on Reed-Solomon codes. The error correction codes used in compact disks are called cross-interleaved Reed-Solomon codes (CIRC) because of the uses of interleaving technique. For the encoding and decoding of computer data in CD-ROM, see the ISO/IEC 10149 mentioned above for more details. The basic data units stored in CD-ROM are logically viewed as logical blocks, called sectors. One sector on a CD-ROM contains 98 frames, and one frame contains 24 bytes. Therefore, one sector contains 98*24=2352 bytes. One sector can further be viewed as containing 2 parts, called C3 codes. Thus, one sector contains two C3 codes of 1170 bytes.

FIG. 1 is a representation of a C3 code in a matrix-like form. In FIG. 1, the numbers ranging from 0000 to 1169 indicate data bytes in the C3 code, which are corresponding to physical addresses in the CD-ROM. A C3 code contains header, user data and auxiliary data (from 0000 to 1031) as well as parity codes, P-parity codes (from 1032 to 1117) and Q-parity codes (from 1118 to 1169) P-parity codes are obtained from performing Reed-Solomon code of (26, 24)FIGS. 2A and 2B respectively show the structure for the P code and Q code. The P code contains 26 bytes, wherein 24 bytes of the P code are code words, and the remaining 2 bytes are parity-check bytes. Similarly, the Q code contains 45 bytes, wherein 43 bytes of the Q code are code words, and the remaining 2 bytes are parity-check bytes.

Referring now to FIG. 3, a conventional method for C3 decoding is showing in flowchart form. As mentioned above, one sector contains two C3 codes. The conventional method performs decoding of one C3 code first, and then performs decoding of the another C3 code in the same steps. For simplicity, only the steps of decoding one C3 code are shown in FIG. 3.

Firstly, a first P code, or called P1 code, is obtained from the C3 code. As shown in FIG. 1, the P1 code contains (0000, 0043, 0086, . . . 0989, 1032, 1075), wherein (0000, 0043, 0086, . . . 0989) represents the code words, and (1032, 1075) represents the parity-check bytes. After the P1 code is obtained, computation of syndrome from P1 code is performed at step 31. Then, at step 32, error-correction for P1 code is performed. For the other P codes, computation of syndrome and error-correction are performed column by column in the same way at step 33.

After the computation of syndrome and error-correction for all P codes of one C3 code are performed completely, the Q codes are to be processed. A first Q code, or called Q1 code, is obtained from the C3 code. As shown in FIG. 1, the Q1 code contains (0000, 0044, 0088, . . . 0730, 1118, 1140), wherein (0000, 0044, 0088, . . . 0730) represents the code words, and (1118, 1140) represents the parity-check bytes. After the Q1 code is obtained, computation of syndrome from Q1 code is performed at step 34. Then, at step 35, error-correction for Q1 code is performed. For the other Q codes, computation of syndrome and error-correction for them are performed sequentially in the same way at step 36. At this stage, the decoding of the C3 code are completed and the conventional method then performs decoding of the another C3 code of the same sector using the same steps 31–36. After the two C3 codes of one sector are decoded, decoding of the other sector is performed.

In summary, the conventional method decodes the C3 codes in sequence. In other words, the computation of syndrome is first performed, and then the error-correction is performed for both P code and Q code sequentially. Besides, in the conventional method, the computation of syndrome and the error-correction for Q codes can be performed before that for P codes. That is to say, the steps 31–33 and steps 34–36 are exchangeable.

However, the disadvantage of the conventional method is a long decoding period due to the sequential decoding steps. A long decoding period results in a slow rate of reading data from the disk to the host machine.

SUMMARY OF THE INVENTION

It is therefore an object of the invention to provide an improved and simplified decoding method. The invention decodes the two C3 codes of one sector using pipelining in parallel. In the invention, the decoding period is reduced and the reading rate is improved.

The invention achieves the above-identified objects by providing a new method of decoding C3 code on a data storage medium. The data storage medium contains a number of sectors, and each sector includes two C3 codes. Each C3 code contains the first signal group and the second signal group. In the decoding method, first of all, the two C3 codes of the same sector are processed in parallel. Then, a syndrome operation is performed on the first signal of the first signal group. Then, a syndrome operation for an (N+1)-th signal of the first signal group and an error-correction for the N-th signal of the first signal group are pipelined until the syndrome operation and the error-correction for all signals of the first signal group are executed, wherein N is a positive integer and an address for the (N+1)-th first signal minus a first value is an address for the N-th first signal. Then, a syndrome operation is performed on the first signal of the second signal group. Then, a syndrome operation for the (N+1)-th signal of the second signal group and an error-correction for the N-th signal of the second signal group are pipelined until the syndrome operation and the error-correction for all signals of the second signal group are executed, wherein the address for the (N+1)-th first signal minus the second value is the address for the N-th first signal.

Further, the first signal group contains P codes and the second signal group contains Q codes. In this case, the first value is 1, and the second value is 43.

Further, the first signal group contains Q codes and the second signal group contains P codes. In this case, the first value is 43, and the second value is 1.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 1 shows the structure of a C3 code;

DESCRIPTION OF THE PREFERRED EMBODIMENT

In the invention, the parallel processing way and the pipeline mode are applied. In the parallel processing way, two C3 codes of the same sector are processed in the same time. As mentioned above, there are two signal groups (P codes and Q codes) in the C3 code. In the pipeline mode, two operations, the syndrome operation and the error-correction are executed together. For simplicity, in the embodiment, only the decoding operation for one C3 code is described, and obviously, the other C3 code are decoded by the same steps at the same time.

First, P codes and Q codes are obtained based on FIG. 1. Because the way to obtain P codes and Q codes is disclosed in Pages 26–37, ISO/IEC 10149:1995 (E), the details are not repeated again.

First of all, the invention performs the syndrome operation for the P1 code, as shown in step 41. Then, the invention executes the syndrome operation for the P(N+1) code and the error-correction for the P(N) code in the same time as shown in step 42, wherein N is a positive integer. That is to say, the syndrome operation for the P(N+1) code and the error-correction for the P(N) code are pipelined.

The address of the P(N+1) code minus 1 is the address for the P(N) code. The pipeline step, step 42, is repeated until the syndrome operation and error-correction for all P codes are completed.

According to the referred embodiment of the invention, similar steps are performed on Q codes. Similarly, the syndrome operation for the Q1 code is performed, as shown in step 43.

The syndrome operation for the Q(N+1) code and the error-correction for the Q(N) code are executed at the same time, as shown in step 44. That is to say, the syndrome operation for the Q(N+1) code and the error-correction for the Q(N) code are pipelined.

Similarly, the address of the Q(N+1) code minus 43 is the address for the Q(N) code. The pipeline step, step 44, is repeated until the syndrome operation and error-correction for all Q codes are completed.

In the embodiment, the syndrome operation and error-correction for the Q codes can be performed before the syndrome operation and error-correction for the P codes. In other words, the steps 41–42 and steps 43–44 are exchangeable.

Figures 2A, 2B, 5:
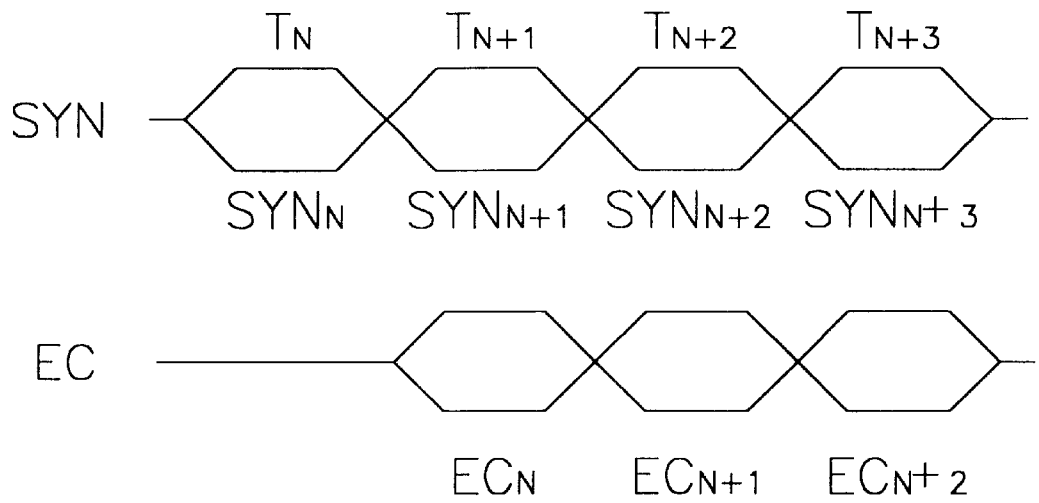
FIGS. 2A and 2B show the structure of the P code and Q code.
FIG. 5 shows a timing chart of the pipeline mode based on the invention.
Figure 3:
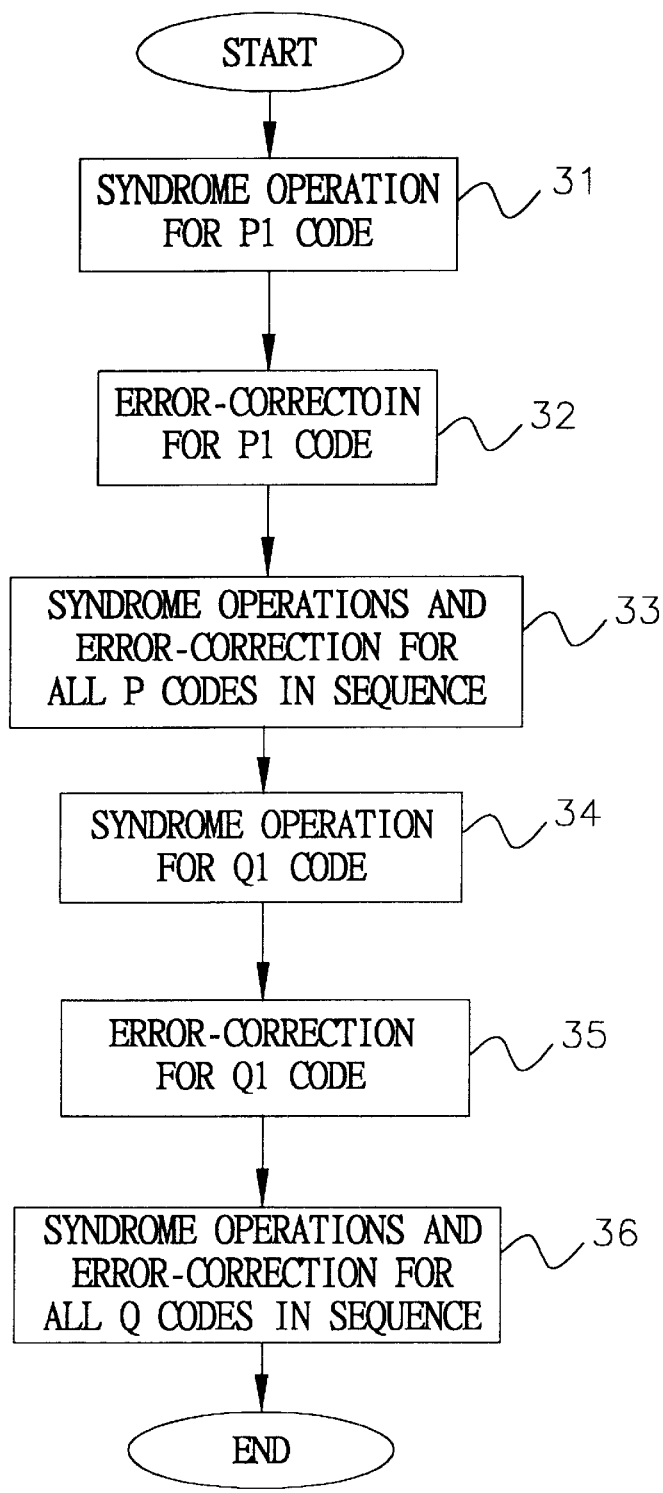
FIG. 3 shows a flow chart of the C3 decoding steps based on the conventional method.
Figure 4:
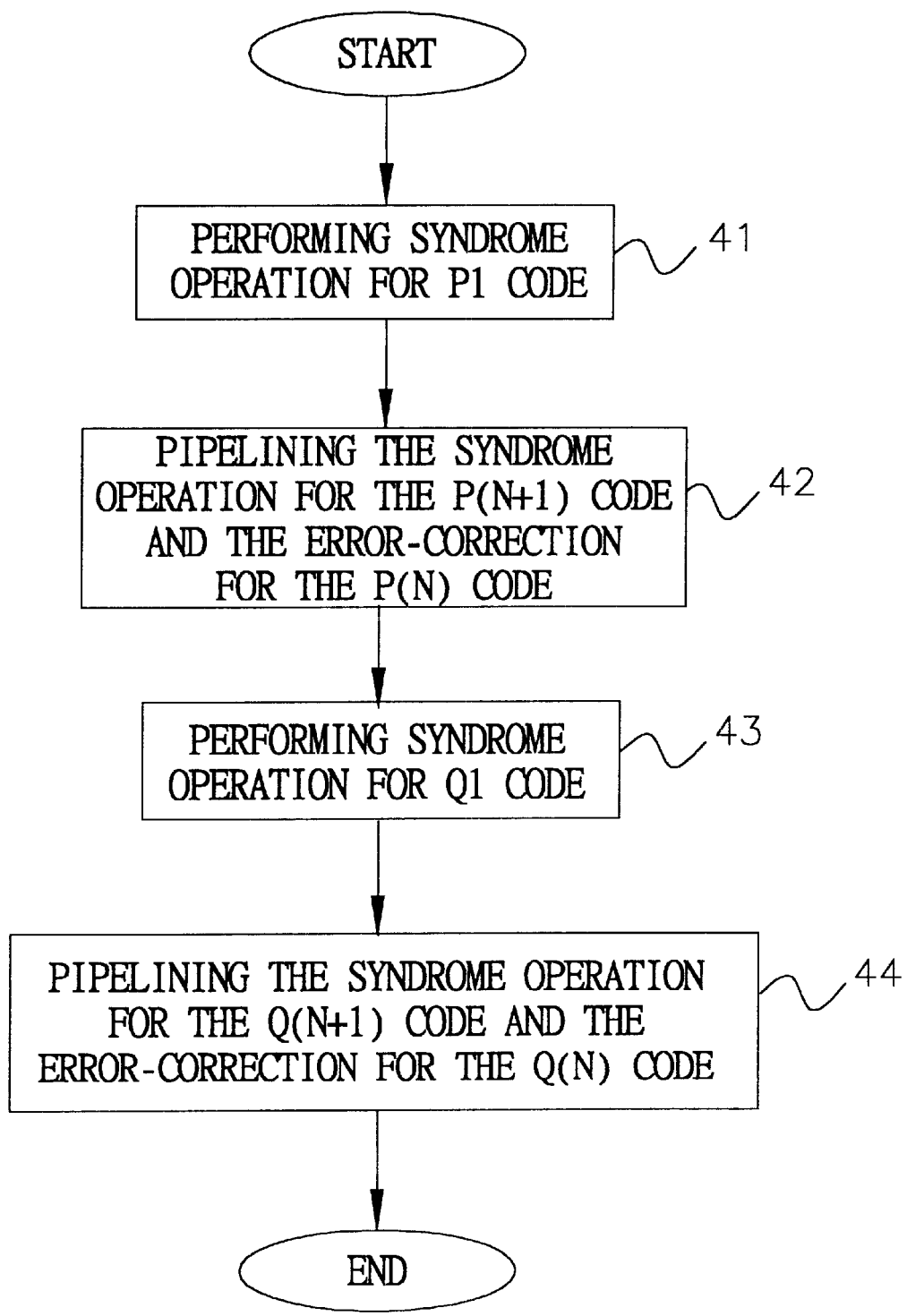
FIG. 4 shows a flow chart of the C3 decoding steps based on the invention.

Now referring to FIG. 5, which shows a timing chart of the pipeline step based on the invention. In FIG. 5, the symbol "SYN" and "EC" respectively represent the timing of the syndrome operation and error-correction.

The symbol "T" represents a cycle of one operation (syndrome operation or error-correction), and "$T_N$" represents the N-th cycle. "$SYN_N$" represents the syndrome operation for P(N) code or Q(N) code. "$EC_N$" represents the error-correction for P(N) code or Q(N) code.

From FIG. 5, the syndrome operation for P(N+1) code (or Q(N+1) code) and the error-correction for P(N) (or Q(N) code) are pipelined in the cycle $T_{N+1}$. By introducing the pipeline step, the decoding time can be effectively reduced according to the invention.

One of the characteristics of the invention is processing two C3 codes of one sector in parallel and pipelining the syndrome operation and error-correction. The decoding rate of the preferred embodiment of the invention is about two times of that of the conventional method due to the parallel processing and pipeline step.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of decoding C3 code on a data storage medium, the data storage medium comprising a plurality of sectors, each sector comprising two C3 codes, each C3 code containing a first signal group and second signal group, the decoding method comprising the steps of:

processing the two C3 codes of the same sector in parallel;

performing a syndrome operation for a first signal of the first signal group;

pipelining a syndrome operation for an (N+1)-th signal of the first signal group and an error-correction for an N-th signal of the first signal group in sequence, wherein N is a positive integer, wherein the (N+1)-th signal and the N-th signal of the first signal group are obtained from the data storage medium according to a first address difference;

performing a syndrome operation for a first signal of the second signal group; and pipelining a syndrome operation for an (N+1)-th signal of the second signal group and an error-correction for an N-th signal of the second signal group in sequence, wherein the (N+1)-th signal and the N-th signal of the second signal group are obtained from the data storage medium according to a second address difference.

2. A method according to claim 1, wherein the first signal group comprises P codes.

3. A method according to claim 2, wherein the second signal group comprises Q codes.

4. A method according to claim 3, wherein the first address difference is 1 and the second address difference is 43.

5. A method according to claim 1, wherein the first signal group comprises Q codes.

6. A method according to claim 5, wherein the second signal group comprises P codes.

7. A method according to claim 6, wherein the first address difference is 43 and the second address difference is 1.

8. A method according to claim 1, wherein the data storage medium is a compact disk.

9. A method of decoding C3 code stored on a compact disk, the compact disk comprising a plurality of sectors, each sector containing two C3 codes, each C3 code containing P codes and Q codes, the decoding method comprising the steps of:

processing the two C3 codes of the same sector in parallel, wherein each of the C3 codes is decoded by the steps of:

decoding the P codes of the C3 code by pipelined operations with a syndrome operation and an error correction until the completion of decoding all the P codes of the C3 code, wherein two immediately adjacent P codes of the P codes of the C3 code, designated as P(N+1) and P(N) respectively, are obtained from the compact disk according to an address difference of one; and decoding the Q codes of the C3 code by pipelined operations with a syndrome operation and an error correction until all the completion of all the Q codes of the C3 code, wherein two immediately adjacent Q codes of the Q codes of the C3 code, designated as Q(N+1) and Q(N), are obtained from the compact disk by according to an address difference of 43.

* * * * *